US009693463B2

(12) United States Patent
Heo

(10) Patent No.: US 9,693,463 B2
(45) Date of Patent: Jun. 27, 2017

(54) TRANSPARENT DISPLAY PANEL AND METHOD OF MANUFACTURING THE SAME

(71) Applicant: LG DISPLAY CO., LTD., Seoul (KR)

(72) Inventor: Joonyoung Heo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 94 days.

(21) Appl. No.: 14/809,069

(22) Filed: Jul. 24, 2015

(65) Prior Publication Data

US 2016/0095210 A1    Mar. 31, 2016

(30) Foreign Application Priority Data

Sep. 29, 2014    (KR) .................. 10-2014-0130119

(51) Int. Cl.
| | |
|---|---|
| H05K 3/32 | (2006.01) |
| H05K 1/09 | (2006.01) |
| H05K 1/02 | (2006.01) |
| H05K 1/18 | (2006.01) |
| H05K 3/10 | (2006.01) |
| H01J 17/49 | (2012.01) |
| H01L 27/32 | (2006.01) |
| G02F 1/1362 | (2006.01) |
| H05K 3/38 | (2006.01) |

(52) U.S. Cl.
CPC ....... *H05K 3/105* (2013.01); *G02F 1/136286* (2013.01); *H01J 17/49* (2013.01); *H01L 27/326* (2013.01); *H01L 27/3279* (2013.01); *G02F 2001/136295* (2013.01); *G02F 2203/01* (2013.01); *H01L 27/3262* (2013.01); *H05K 1/09* (2013.01); *H05K 3/388* (2013.01); *H05K 2201/0175* (2013.01); *H05K 2201/0326* (2013.01); *H05K 2203/095* (2013.01); *H05K 2203/1136* (2013.01)

(58) Field of Classification Search
None
See application file for complete search history.

(56) References Cited

U.S. PATENT DOCUMENTS

| | | | | |
|---|---|---|---|---|
| 2010/0200861 A1* | 8/2010 | Lee | ...................... | H01L 27/3276 257/72 |
| 2013/0015450 A1* | 1/2013 | Kim | ...................... | H01L 51/5275 257/59 |
| 2013/0153870 A1* | 6/2013 | Seo | ...................... | H01L 51/5262 257/40 |
| 2013/0168707 A1* | 7/2013 | Huang | ................ | H01L 27/1244 257/88 |
| 2013/0200379 A1* | 8/2013 | You | ...................... | H01L 29/4908 257/59 |

\* cited by examiner

*Primary Examiner* — Ashok Patel
(74) *Attorney, Agent, or Firm* — Birch, Stewart, Kolasch & Birch, LLP

(57) ABSTRACT

A transparent display panel, and a method of manufacturing the transparent display panel are discussed. The transparent display panel according to one embodiment includes a substrate; a driving element formed in a display pixel area on the substrate; a wiring electrode formed in the display pixel area and connected to the driving element; and a transparent wiring electrode formed in a transmissive area on the substrate, the transparent wiring electrode being extended to connect to the wiring electrode in the display pixel area.

23 Claims, 12 Drawing Sheets

TRANSPARENT DISPLAY PANEL AND METHOD OF MANUFACTURING THE SAME

CROSS-REFERENCE TO RELATED APPLICATIONS

This application claims the priority of Korean Patent Application No. 10-2014-0130119 filed on Sep. 29, 2014, in the Korean Intellectual Property Office, the entire contents of which are incorporated herein by reference.

BACKGROUND

Field of the Invention

The present invention relates to a transparent display panel capable of maximizing the aperture ratio of a transmissive portion, and a method of manufacturing the same.

Description of the Related Art

Flat display panels can have large or small screens and thus can be used in a wide range of applications. Currently, flat display panels are manufactured in a variety of types of displays and can be sorted into, for example, plasma display panels (PDPs), liquid crystal display panels (LCDs), and organic light-emitting diode display panels (OLEDs).

A transparent display panel displays information thereon to viewers and also transmits light from a background so that the viewers can see the background through the display panel. For a transparent display panel, the technology that allows viewers to easily see a background behind the transparent display panel is as important as the technology that efficiently displays information on the display panel. A typical display panel includes unit pixels, each consisting of a plurality of sub-pixels. Typically, the color of a unit pixel is represented by an appropriate combination of colors of the sub-pixels. By controlling colors of a plurality of unit pixels, information is displayed in a display panel.

Each of a plurality of sub-pixels is partitioned as a transmissive portion and a display portion. In the display portion, a sub-pixel represents a color of the display portion. Through the transmissive portion, viewers can see a background behind the display panel. For such a display panel in which every sub-pixel or pixel has a display portion and a transmissive portion, an appropriate ratio between the display portion and the transmissive portion is set, as well as the aperture ratio. A display panel includes driving circuits to drive sub-pixels, electrodes connected to the driving circuits, and electrodes for many other purposes. The aperture ratio of the transmissive portion of the transparent display panel cannot be increased due to the electrodes.

FIG. 1 is a schematic plan view of an existing transparent display panel including a transmissive area and a display pixel area. The transparent display panel 100 includes at least one transmissive area 120 and at least one display pixel area 130 on a substrate 110. The transparent display panel 100 can include a transmissive area 120, but is not limited thereto. Each unit pixel includes at least one sub-pixel, and sub-pixels are separated by a black matrix 111.

The sub-pixels in the display pixel area 130 can include red (R), green (G), blue (B) and white (W) sub-pixels. There exist elements for controlling the sub-pixels individually. At least one electrode for driving the display pixel area 130 can be disposed in the transparent display panel. Such electrodes may be one or more signal/data lines for delivering driving signals, or electrodes for supplying current to pixels and the like. In the transparent display panel 100, such electrodes are hidden by a black matrix 111 so as not to make the display difficult to view due to reflected light or the like. The ratio of the transmissive area 120 to the display pixel area 130 can be adjusted for the efficiency of the display pixel area 130 and transmissivity.

In particular, a transparent display panel includes electrodes formed in a display area and a non-aperture area that is covered by a black matrix to secure transmissivity of a transmissive area and the aperture ratio of the transmissive area. In the non-aperture area defined by the black matrix, driving signal electrodes for driving sub-pixels or electrodes for supplying current for driving the sub-pixels are disposed. Therefore, there exists a limit to expand the aperture ratio of the transmissive portion.

SUMMARY

Accordingly, an object of the present invention is to provide a transparent display panel including an aperture ratio that can be increased by using transparent electrodes in the transparent portion, and a method for manufacturing the same. Such transparent electrodes that can be applied in the transparent portion are made of a transparent conductive material. Because a transparent conductive material has a relatively high electrical resistivity and thus increases its current consumption, a transparent display panel with improved transmissivity and low current consumption can include transparent electrodes that still have low electrical resistivity as electrodes for a transparent portion.

Another object of the present invention is to provide a transparent display panel that includes transparent electrodes with lower electric resistivity so that current consumption can be reduced, and a method of manufacturing the same. Objects of the present invention are not limited to those described above and other objects will be clearly understood by those skilled in the art from the following descriptions.

According to an aspect of the present invention, there is provided a transparent display panel with improved transmissivity by employing a transparent wiring electrode. A substrate has a transmissive area and a display pixel area defined thereon. In the display pixel area, driving elements to control the driving of display pixels, and wiring electrodes are disposed. In the transmissive area, transparent wiring electrodes connected to the wiring electrodes are disposed. By employing transparent wiring electrodes in the transmissive area, the transmissivity of the panel can be improved.

According to another aspect of the present invention, there is provided a method of manufacturing a transparent display panel. A transmissive area and a display pixel area are defined on a substrate. In the display pixel area, driving elements and wiring electrodes are formed. In the transmissive area, transparent wiring electrodes are formed and are made to be conductive. By doing so, the transmissivity of the transmissive area is improved and current consumption of the transparent display panel can be decreased.

According to exemplary embodiments of the present invention, the aperture ratio of a transmissive area of a transparent display panel can be improved by way of employing transparent wiring electrodes. Further, transparent wiring electrodes are formed during the step of forming electrodes in driving elements, so that the process can be simplified. In addition, according to exemplary embodiments of the present invention, current consumption of a transparent display panel can be reduced by way of employing indium-gallium-zinc-oxide (IGZO) subjected to a plasma treatment as transparent electrodes. Effects of the present invention are not limited to those described above and other effects of the present invention will be apparent to those skilled in the art from the following descriptions. The scope of the claims is not limited to the aforementioned effects.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
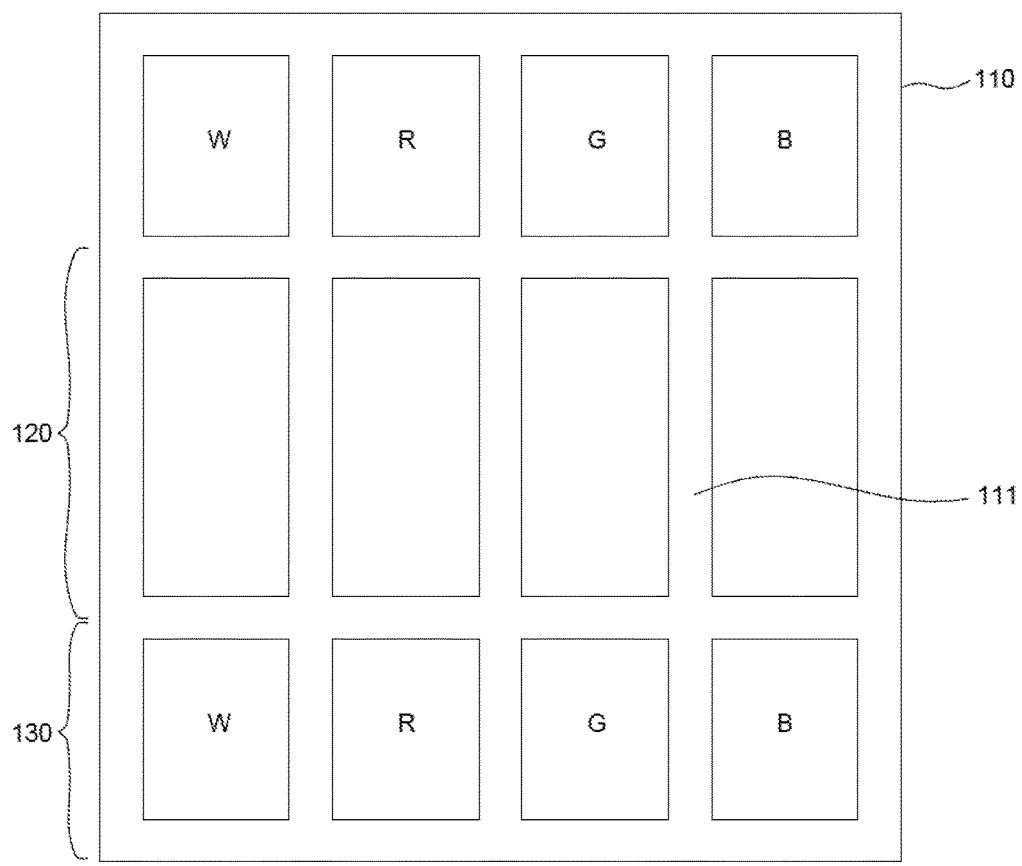
FIG. 1 is a schematic plan view of a general transparent display panel including a transmissive area and a display pixel area according to related art.

Advantages and features of the present invention and methods to achieve them will become apparent from the descriptions of embodiments herein below with reference to the accompanying drawings. However, the present invention is not limited to embodiments disclosed herein but may be implemented in various different forms. The embodiments are provided for making the invention of the present invention thorough and for fully conveying the scope of the present invention to those skilled in the art. It is to be noted that the scope of the present invention is defined only by the claims.

Advantages and features of the present invention and methods to achieve them will become apparent from the descriptions of embodiments herein below with reference to the accompanying drawings. However, the present invention is not limited to embodiments disclosed herein but may be implemented in various different ways. The embodiments are provided for making the disclosure of the present invention thorough and for fully conveying the scope of the present invention to those skilled in the art. It is to be noted that the scope of the present invention is defined by the claims, but is not limited thereto.

The figures, dimensions, ratios, angles, numbers of elements given in the drawings are merely illustrative and are not limiting. Like reference numerals denote like elements throughout the descriptions. Further, in describing the present invention, descriptions on well-known technologies may be omitted in order not to obscure the gist of the present invention. It is to be noticed that terms "comprising," "having," "containing," and "including" should not be interpreted as being restricted to a means listed thereafter unless specifically stated otherwise. Where an indefinite or definite article is used when referring to a singular noun, e.g., "a," "an," "the," this includes a plural of that noun unless specifically stated otherwise.

In describing elements, the elements are interpreted as including error margins even without explicit statements. In describing a positional relationship, such as "an element A on an element B," "an element A above an element B," "an element A below an element B" and "an element A next to an element B," another element C can be disposed between the elements A and B unless the term "directly" or "immediately" is explicitly used. In describing a temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present invention.

Features of various embodiments of the present invention may be combined partially or totally. As will be clearly appreciated by those skilled in the art, technically various interactions and operations are possible. Various embodiments can be practiced individually or in combination. In the following descriptions, a variety of configurations of a transparent display panel with an improved aperture ratio according to embodiments of the present invention. According to a configuration of a transparent display panel, a transmissive area and a display pixel area are defined in the transparent display panel. The transmissive area transmits light therethrough so that a background behind the display panel is visible. The display pixel area displays a variety of pieces of information thereon. Hereinafter, embodiments of the present invention will be described in detail with reference to the accompanying drawings.

Figure 2A:
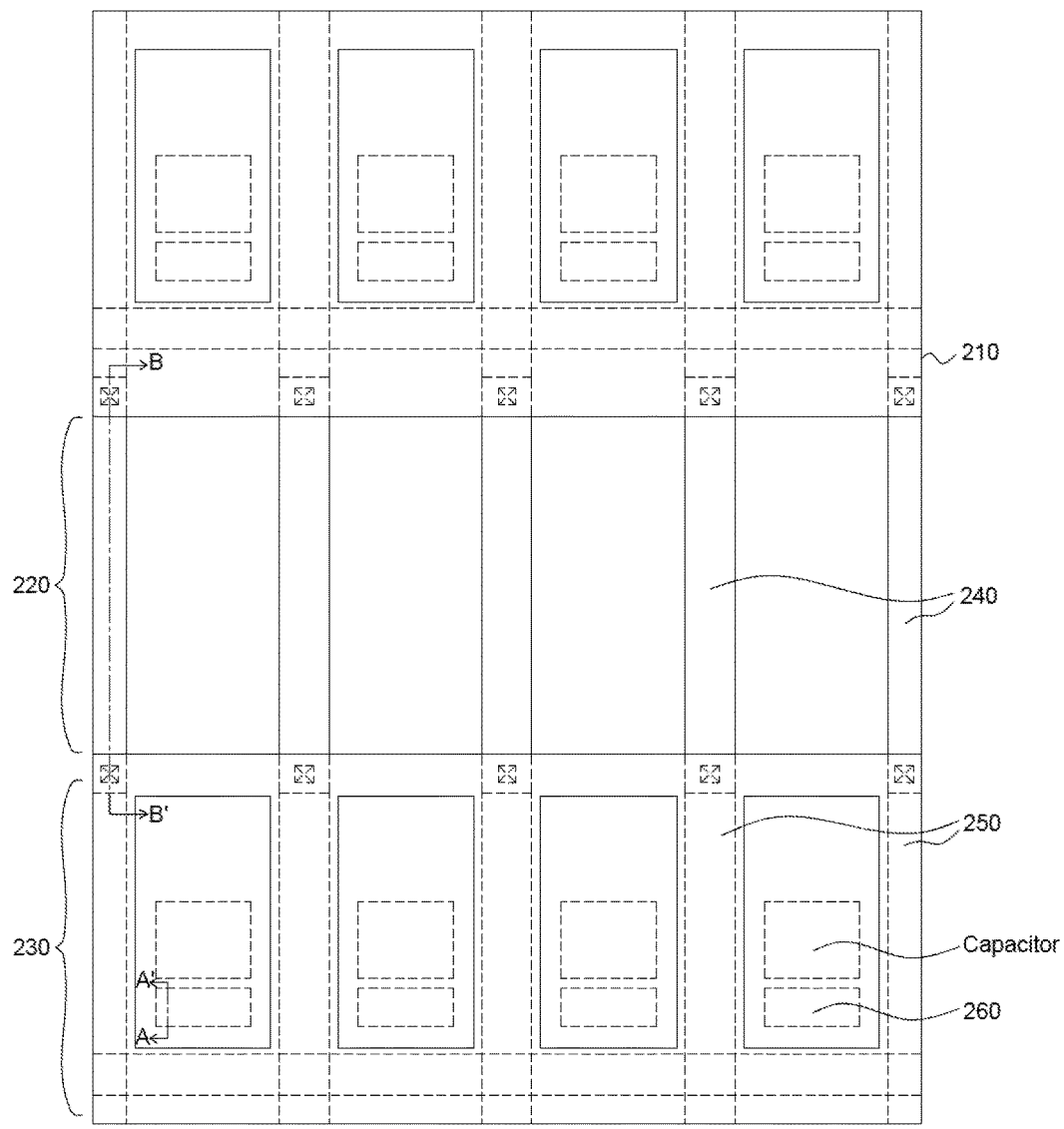
FIG. 2A is a schematic plan view of a transparent display panel according to an embodiment of the present invention, which includes transparent wiring electrodes in a transparent portion so that the aperture ratio thereof is improved.

FIG. 2A is a schematic plan view of a transparent display panel according to an embodiment of the present invention, which includes transparent wiring electrodes in a transparent portion so that the aperture ratio thereof is improved. The transparent display panel 200 includes a transmissive area 220 and a display pixel area 230 defined in a substrate 210.

The display pixel area 230 includes driving elements 260, capacitors, and wiring electrodes 250 connected to the driving elements. The wiring electrode 250 can be a data line for driving elements 260, a common line that supplies electric current to a pixel, or a scan line.

The transmissive area 220 includes transparent wiring electrodes 240. The transparent wiring electrodes 240 are extended to the display pixel area 230 to be connected to the wiring electrodes 250. The transparent wiring electrode 250 connects with the wiring electrode 250 to extend a data line of transparent display panel 200 or extend an electrode for supplying current to pixels. Because the transmissive area 220 includes the transparent wiring electrodes 240, a black matrix can be omitted from the transmissive area 220 or decreased in size. Accordingly, the transmissivity of the transparent display panel 200 can be improved, and limitations to the overall area of the transmissive area 120 or the aperture ratio can be avoided.

Figure 2B:
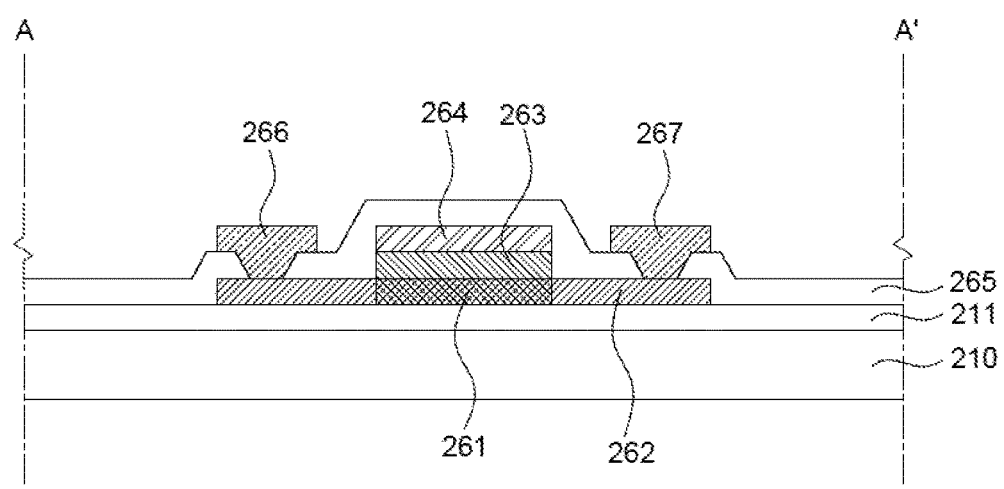
FIGS. 2B and 2C are schematic cross-sectional views for illustrating a display pixel area and a transmissive area according to an embodiment of the present invention.
Figure 2C:
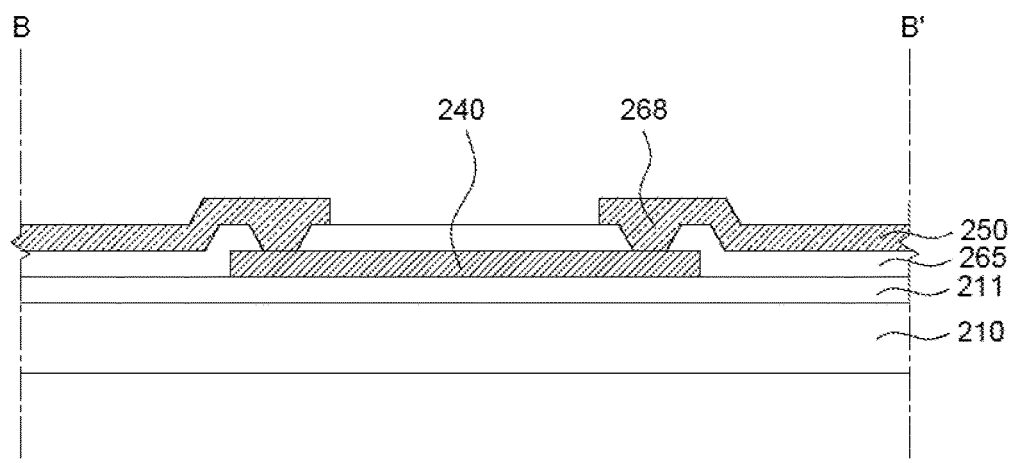

Next, FIGS. 2B and 2C are schematic cross-sectional views for illustrating a display pixel area and a transmissive area according to an embodiment of the present invention. In particular, FIG. 2B is a schematic cross-sectional view of a driving element 260 of FIG. 2A, taken along line A-A'; and FIG. 2C is a schematic cross-sectional view of the transmissive area 220 including the transparent wiring electrodes 240 of FIG. 2A, taken along line B-B'.

Referring to FIG. 2B, the substrate 210 can include a buffer layer 211. In the driving element 260, source/drain electrodes 266 and 267 and an insulation layer 265 are disposed on an active electrode 261 and a conductive active electrode 262. A gate electrode 264 may be disposed on the active electrode 261. A gate insulation layer 263 may be disposed between the active electrode 261 and the gate electrode 264.

Referring to FIG. 2C, a transparent wiring electrode 240 is disposed on the buffer layer 211 formed on the substrate 210. The insulation layer 265 is formed over the transparent wiring electrode 240. The insulation layer 265 includes at least one opening 268. The transparent wiring electrode 240 extended to the display pixel area 230 is connected to the wiring electrodes 250 via the opening 268.

The transparent wiring electrode 240 may be made of the same material as that of the conductive active electrode 262 of the driving element 260. When the transparent wiring electrode 240 and the conductive active electrode 262 are made of the same material, electrical resistivity is low, so that power consumption can be saved. Further, the manufacturing process can be simplified.

The transparent wiring electrode 240 and the conductive active electrode 262 may be made of a material having a transmissivity of 80% or higher, such as IGZO that has been subjected to a process to make it conductive. Detailed description thereof will be made below. The wiring electrode 250 may be made of Mo/Al/Mo or Cu/Mo/Ti having low electrical resistivity, or a compound thereof.

Figure 3A:
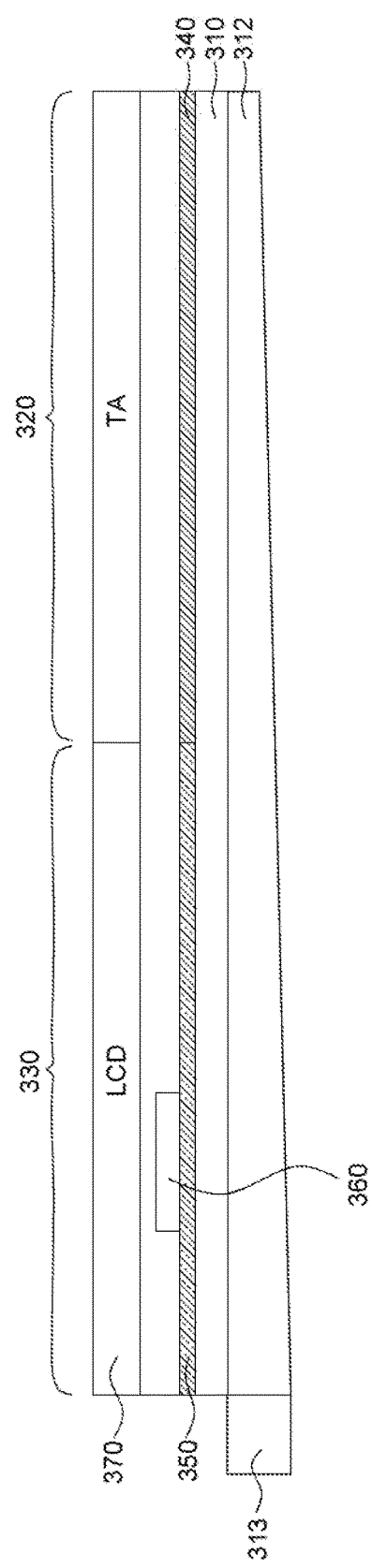
FIGS. 3A and 3B are schematic cross-sectional views for illustrating examples to which an embodiment of the present invention is applied.
Figure 3B:
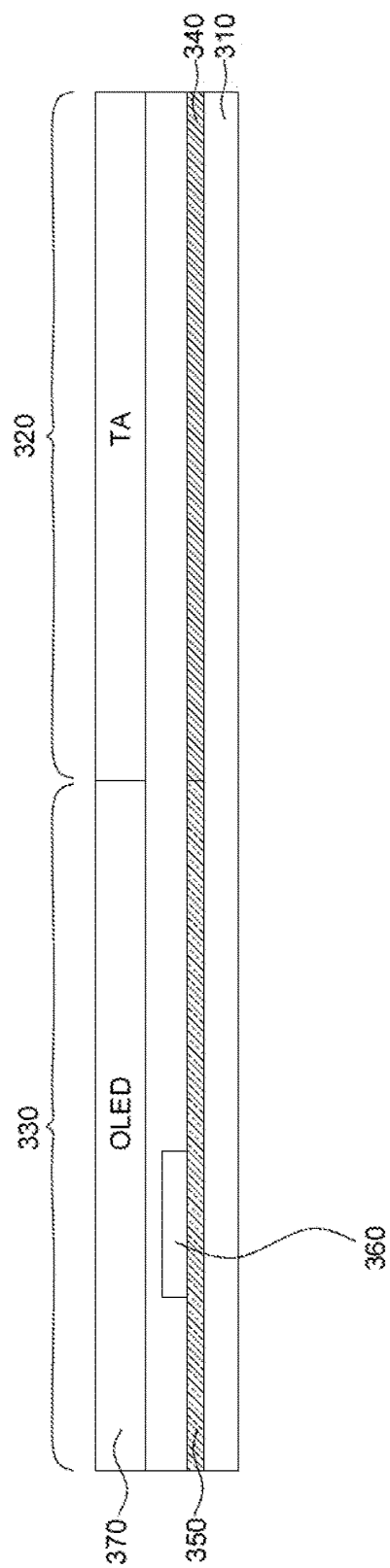

Next, FIGS. 3A and 3B are schematic cross-sectional views for illustrating examples to which an embodiment of the present invention is applied. In particular, FIG. 3A shows an example in which an embodiment of the present invention is applied to a liquid crystal display. The number of pixels, etc. are schematically illustrated for convenience of Illustration; and FIG. 3B shows an example in which an embodiment of the present invention is applied to an organic light-emitting display. A transmissive area (TA) 320 and a display pixel area 330 are defined in a substrate 310.

Referring to FIG. 3A, a substrate 310 may include a light guide plate 312. The light guide plate 312 is connected to a backlight unit 313 to guide light from the light source. A wiring electrode 350 and a transparent wiring electrode 340 are formed on the substrate 310. The wiring electrode 350 is connected to the transparent wiring electrode 340 so as to supply electric current to a respective driving element 360, a liquid crystal layer 370 and the like in a display pixel area 330. A transparent wiring electrode 340 is formed to be fitted to the transmissive area 320, so that the aperture ratio of the transmissive area 320 can be improved. The display pixel area 330 includes a driving element 360 and an organic light-emitting element 370. The driving element 360 is connected to a wiring electrode 350 to receive signals and current necessary for driving. The wiring electrode 350 is connected to a transparent wiring electrode 340 in the transmissive area 320.

Next, FIGS. 4A to 4F are schematic cross-sectional views for illustrating a method of manufacturing a transparent display panel according to an embodiment of the present invention.

Figure 4A:
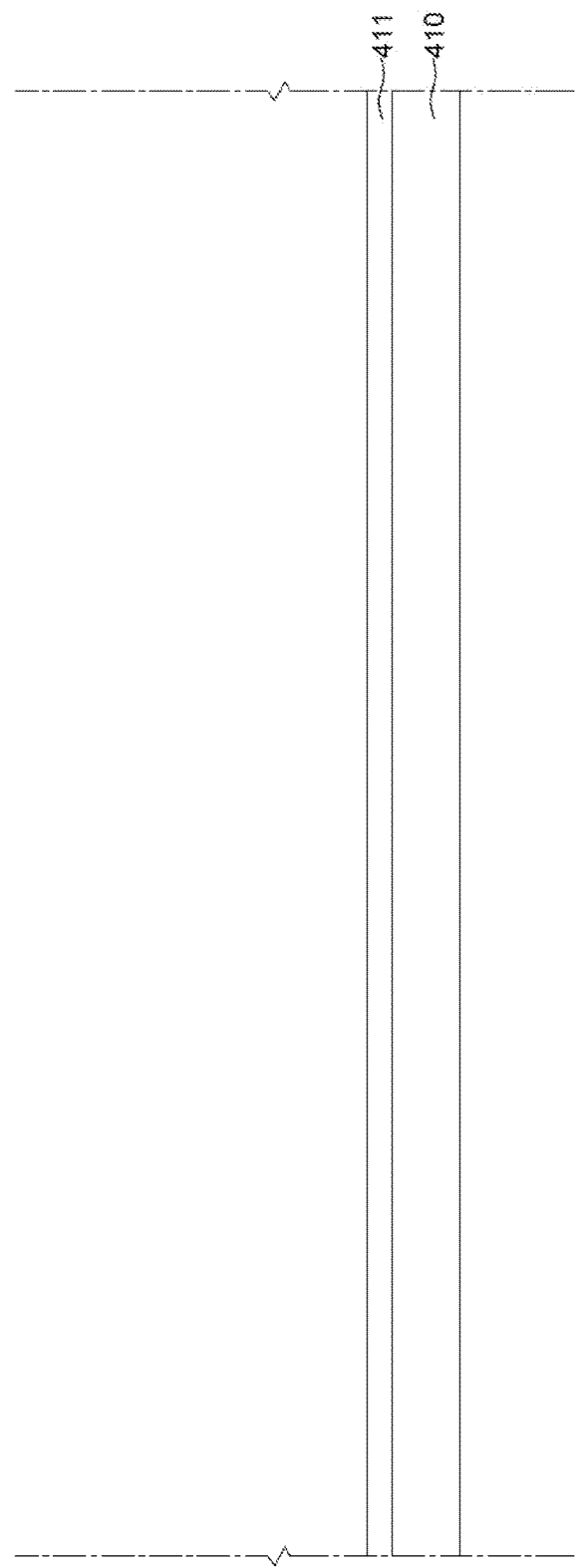
FIGS. 4A to 4F are schematic cross-sectional views for illustrating a method of manufacturing a transparent display panel according to an embodiment of the present invention.

Referring to FIG. 4A, a buffer layer 411 may be formed on a substrate 410. The buffer layer 411 may be made of SiO2, for example. The buffer layer serves to prevent permeation of moisture and oxygen.

Figure 4B:
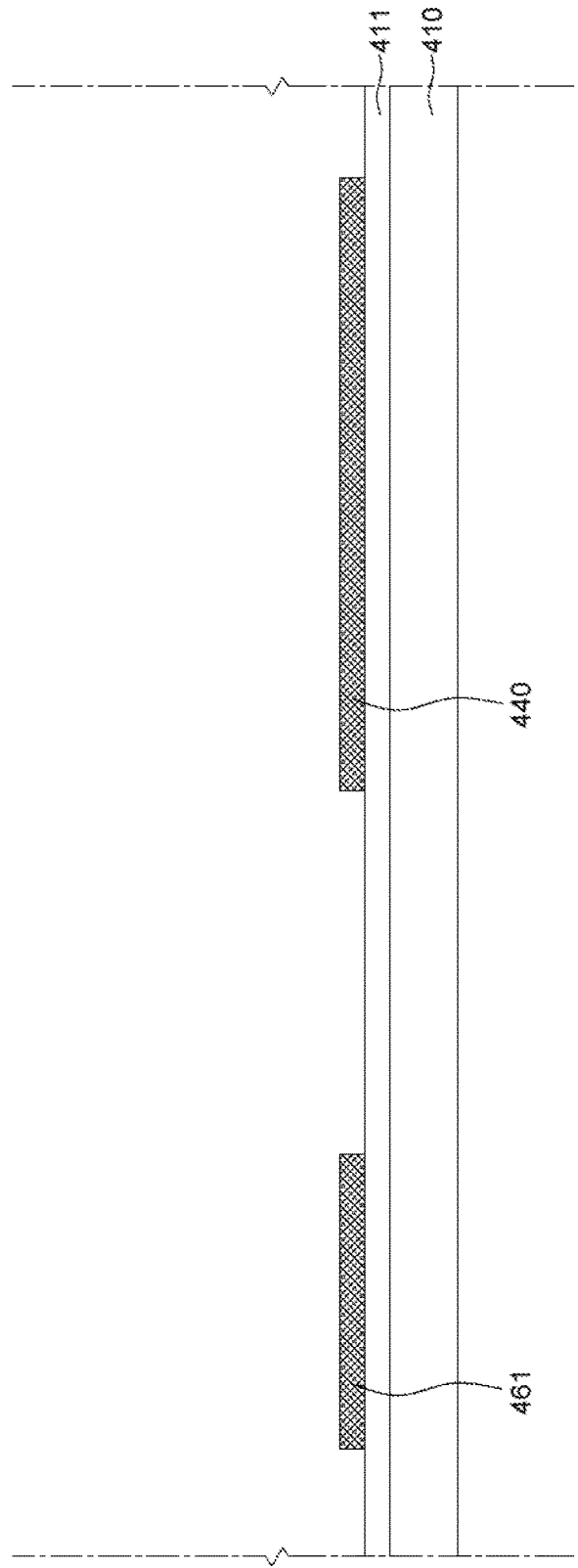

Referring to FIG. 4B, an active electrode 461 and a transparent wiring electrode 440 are formed on the substrate 410. The active electrode 461 and the transmissive wiring electrode 440 may be formed together, and are made of a transparent material such as indium-gallium-zinc-oxide (IGZO). Since the IGZO material inherently has a nature of a semiconductor, the transmissive wiring electrode 440 needs to be subjected to a process to make it conductive. Such a process will be described below.

Figure 4C:
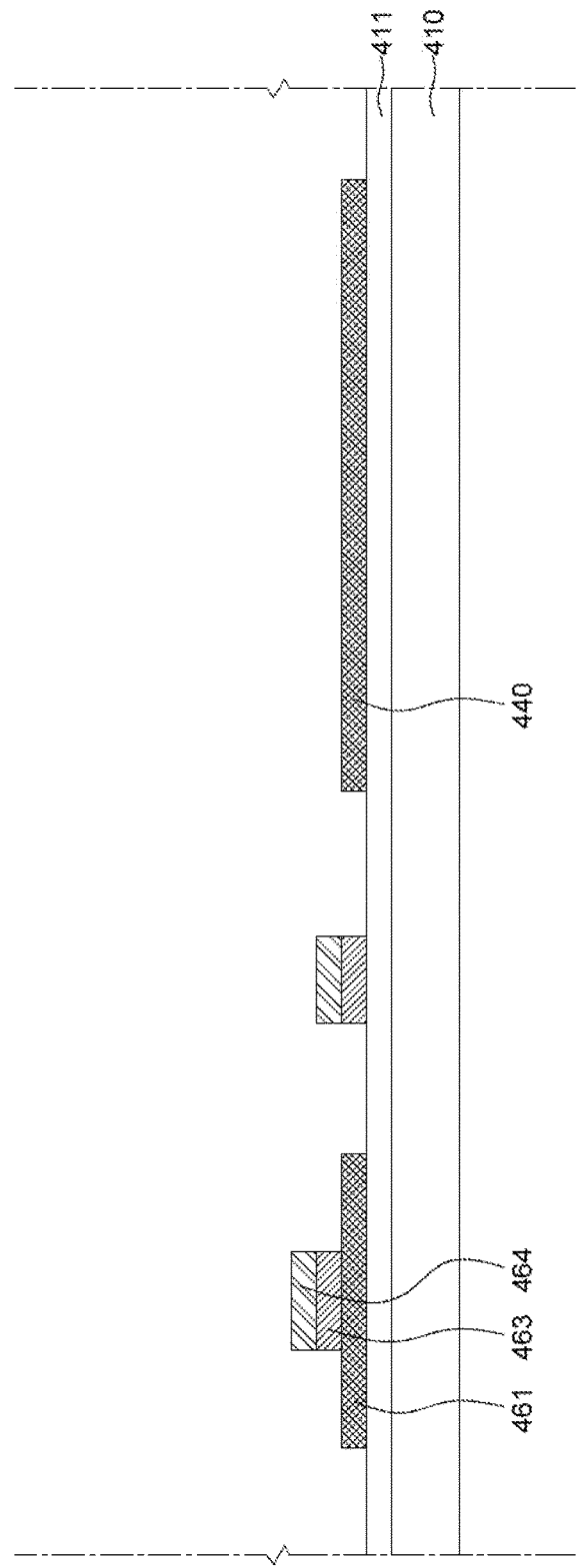

Referring to FIG. 4C, a gate insulation layer 463 is formed on the active electrode 461. The insulation layer 463 may be made of SiO2, for example. The gate electrode 464 may be made of a metal material including, for example, Mo/Al/Mo or Cu/Mo/Ti.

Figure 4D:
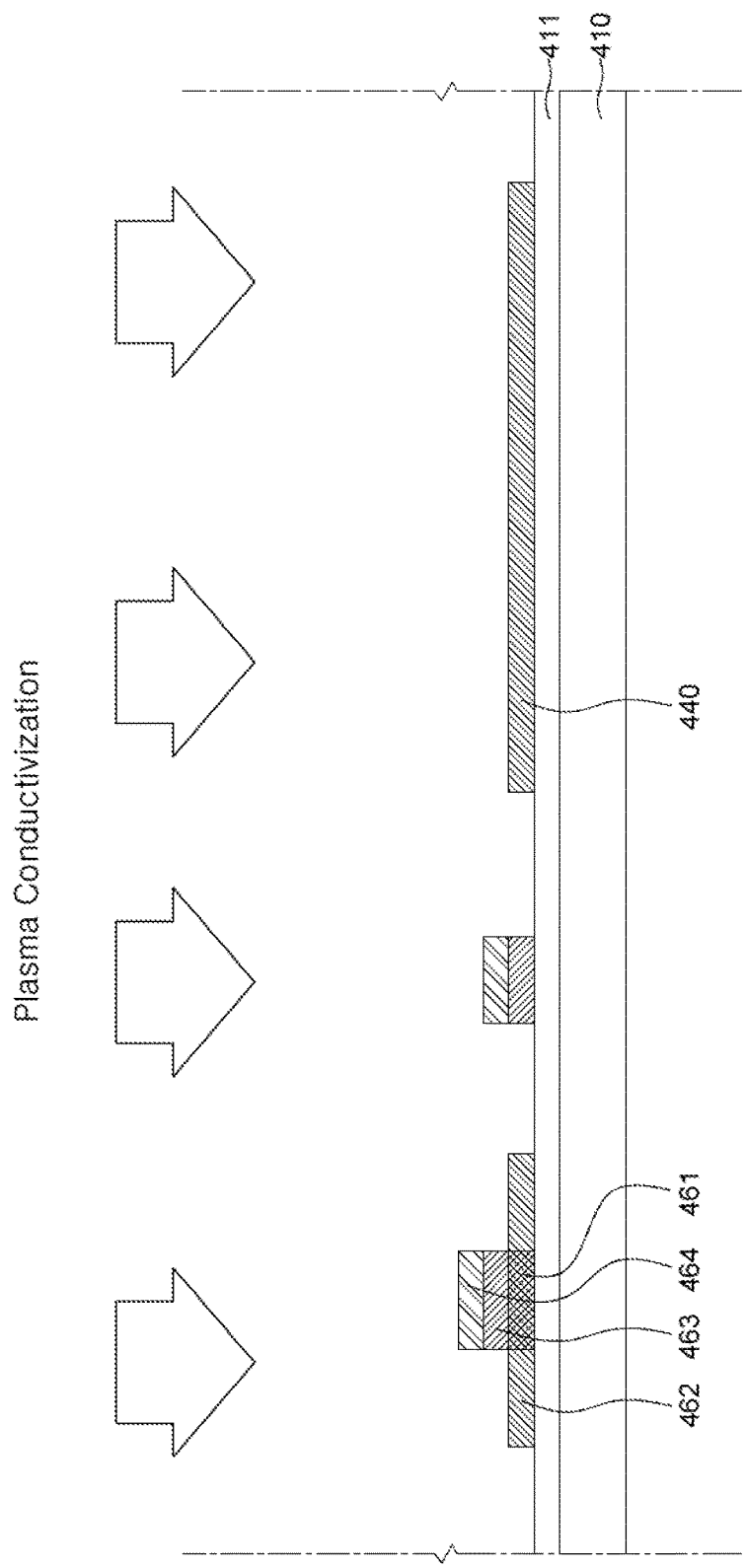

Referring to FIG. 4D, the active electrode 461 is made conductive by a plasma treatment to thereby form a conductive active electrode 462. At this time, the transmissive wiring electrode 440 is also subjected to the plasma treatment, so that the transmissive wiring electrode 440 is made conductive and thus has low electrical resistivity. The plasma treatment may be carried out with H2 or He. The power for generating plasma may be set to be 500 W. The processing time may be set to be 30 sec to 60 sec.

Figure 4E:
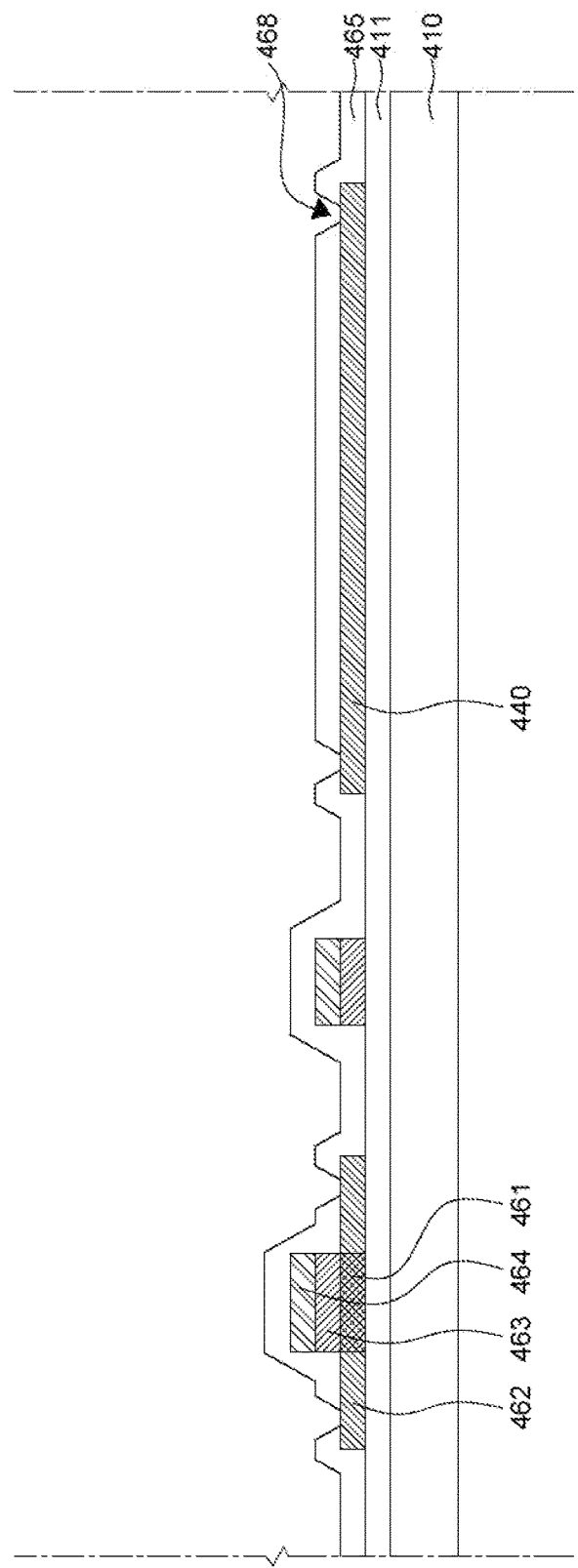

Referring to FIG. 4E, an insulation layer 465 is formed on the substrate 410. The insulation layer has openings 468 each above the transmissive wiring electrode 440 and the conductive active electrode 462.

Figure 4F:
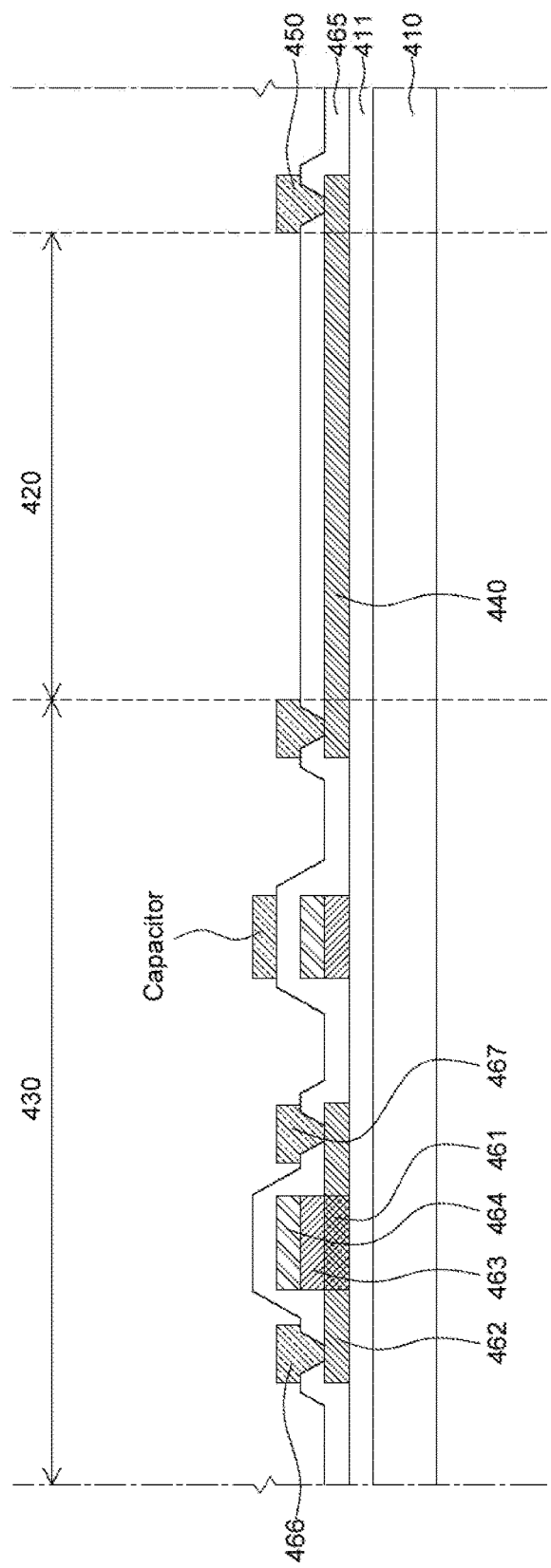

Referring to FIG. 4F, a wiring electrode 450 connected to the transmissive wiring electrode 440 is formed in the display pixel area 430. The wiring electrode 450 may be formed of Mo/Al/Mo or Cu/Mo/Ti. The wiring electrode 450 may be made of the same material as and together with the source/drain electrodes 466 and 467 connected to the conductive active electrode 462. As described above, the transparent wiring electrode 440 with low electrical resistivity can be formed by using IGZO subjected to the plasma treatment. Further, the transparent wiring electrode 440 can be formed during, for example, the step of forming driving elements, so that the process can be simplified.

In some embodiments of the present invention, the transparent display panel further includes a buffer layer on the substrate. In some embodiments of the present invention, the transparent display panel further includes an organic light-emitting element disposed in the display pixel area. In seine embodiments of the present invention, the transparent display panel further includes a liquid crystal layer disposed in the display pixel area, a light guide plate, and a backlight unit. In some embodiments of the present invention, the transparent display panel further includes an insulation layer on the substrate. In some embodiments of the present invention, the substrate, the transparent wiring electrode and the insulation layer are stacked on one another in this order in the transmissive area. In some embodiments of the present invention, the substrate, the driving element, the insulation layer and the wiring electrode are stacked on one another in this order in the display pixel area. In some embodiments of the present invention, the insulation layer includes at least one opening, and the wiring electrode is connected to the transparent wiring electrode via the opening. In some embodiments of the present invention, the driving element includes an active electrode, a gate electrode, an insulation layer, a source electrode and a drain electrode, and the transparent wiring electrode is made of the same material as one of electrodes of the driving element. In some embodiments of the present invention, the transparent wiring electrode is subjected to a H2 or He plasma treatment.

According to one embodiment of the present invention, there is provided a method of manufacturing a transparent display panel. The method includes preparing a substrate. A transmissive area and a display pixel area are defined in the substrate, forming a driving element in the display pixel area, forming a wiring electrode in the display pixel area, forming a transparent wiring electrode in the transmissive area, and making the transparent wiring electrode conductive. In some embodiments of the present invention, the making the transparent wiring electrode conductive includes treating the transparent wiring electrode with H2 or He plasma. In some embodiments of the present invention, the forming the driving element further includes forming an active electrode, a gate electrode, an insulation layer, a source electrode, a drain electrode, and a wiring electrode connected to the driving element. In some embodiments of the present invention, the forming the driving element includes forming the transparent wiring electrode conductive. In some embodiments of the present invention, the forming the driving element includes forming an opening in the insulation layer, and connecting the transparent wiring electrode to the wiring electrode via the opening.

Thus far, embodiments of the present invention have been described in detail with reference to the accompanying drawings. However, the present invention is not limited to the embodiments, and modifications and variations can be made thereto without departing from the technical idea of the present invention. Accordingly, the embodiments described herein are merely illustrative and are not intended to limit the scope of the present invention. The technical idea of the present invention is not limited by the embodiments. Therefore, it should be understood that the above-described embodiments are not limiting but illustrative in all aspects. The scope of protection sought by the present invention is defined by the appended claims and all equivalents thereof are construed to be within the true scope of the present invention.

Although the embodiments of the present invention have been described with reference to the accompanying drawings, those skilled in the art would understand that various modifications and alterations may be made without departing from the technical idea or essential features of the present invention. Therefore, it should be understood that the above-mentioned embodiments are not limiting but illustrative in all aspects.

What is claimed is:

1. A transparent display panel comprising:
   a substrate;
   a driving element formed in a display pixel area on the substrate;
   a first wiring electrode formed in the display pixel area and connected to the driving element; and
   a second wiring electrode formed in a transmissive area on the substrate and not connected to the driving element, the second wiring electrode being a transparent wiring electrode and extended to connect to the first wiring electrode in the display pixel area.

2. The transparent display panel of claim 1, wherein the second wiring electrode is made of indium-gallium-zinc-oxide (IGZO).

3. The transparent display panel of claim 2, wherein the second wiring electrode is subjected to a H2 or He plasma treatment.

4. The transparent display panel of claim 2, wherein the second wiring electrode is a data line for the driving element.

5. The transparent display panel of claim 2, wherein the second wiring electrode is a common line that supplies electric current to a pixel.

6. The transparent display panel of claim 2, wherein the second wiring electrode is a scan line.

7. The transparent display panel of claim 2, wherein the second wiring electrode is at least one of a data line for the driving element, a common line that supplies electric current to a pixel, and a scan line.

8. The transparent display panel of claim 2, further comprising:
   an insulation layer formed over the second wiring electrode and including at least one opening through which the second wiring electrode is extended to the display pixel area to be connected to the first wiring electrode.

9. The transparent display panel of claim 1, further comprising:
   an active electrode formed on the substrate, wherein the active electrode and the second wiring electrode are formed together.

10. The transparent display panel of claim 9, wherein the active electrode and the second wiring electrode are made of indium-gallium-zinc-oxide (IGZO).

11. The transparent display panel of claim 1, further comprising:
    an insulation layer formed between the first wiring electrode and the second wiring electrode in a vertical direction, the insulation layer including at least one opening through which the second wiring electrode is extended to the display pixel area to be connected to the first wiring electrode.

12. The transparent display panel of claim 1, further comprising:
    an insulation layer formed at a vertical axis to be both under the first wiring electrode and over the second wiring electrode.

13. The transparent display panel of claim 1, wherein the second wiring electrode is not formed in the display pixel area on the substrate.

14. A method of manufacturing a transparent display panel, the method comprising:
    forming a driving element in a display pixel area on a substrate;
    forming a first wiring electrode in the display pixel area on the substrate to be connected to the driving element; and
    forming a second wiring electrode which is transparent in a transmissive area on the substrate to be not connected to the driving element and treating the second wiring electrode to make the second wiring electrode conductive, the second wiring electrode being extended to connect to the first wiring electrode in the display pixel area.

15. The method of claim 14, further comprising:
    forming an insulation layer over the second wiring electrode and including at least one opening through which the second wiring electrode is extended to the display pixel area to be connected to the first wiring electrode.

16. The method of claim 14, further comprising:
    forming an active electrode on the substrate, wherein the active electrode and the second wiring electrode are formed together.

17. The method of claim 16, wherein the active electrode and the second wiring electrode are made of indium-gallium-zinc-oxide (IGZO).

18. The method of claim 14, wherein the second wiring electrode is made of indium-gallium-zinc-oxide (IGZO).

19. The method of claim 18, wherein the forming of the second wiring electrode includes subjecting the second wiring electrode to a H2 or He plasma treatment.

20. The method of claim 18, wherein the second wiring electrode is a data line for the driving element.

21. The method of claim 18, wherein the second wiring electrode is a common line that supplies electric current to a pixel.

22. The method of claim 18, wherein the second wiring electrode is a scan line.

23. The method of claim 18, wherein the second wiring electrode is at least one of a data line for the driving element, a common line that supplies electric current to a pixel, and a scan line.

* * * * *